(12) United States Patent
Yu et al.

(10) Patent No.: US 7,385,572 B2
(45) Date of Patent: Jun. 10, 2008

(54) ORGANIC ELECTRONIC DEVICE HAVING IMPROVED HOMOGENEITY

(75) Inventors: Gang Yu, Santa Barbara, CA (US); Jian Wang, Goleta, CA (US); Weixiao Zhang, Goleta, CA (US); Matthew Stevenson, Santa Maria, CA (US)

(73) Assignee: E.I du Pont de nemours and company, Wilmington, DE (US)

( * ) Notice: Subject to any disclaimer, the term of this patent is extended or adjusted under 35 U.S.C. 154(b) by 412 days.

(21) Appl. No.: 10/646,306

(22) Filed: Aug. 22, 2003

(65) Prior Publication Data

US 2004/0183759 A1   Sep. 23, 2004

Related U.S. Application Data

(60) Provisional application No. 60/409,172, filed on Sep. 9, 2002.

(51) Int. Cl.
*G09G 3/30* (2006.01)

(52) U.S. Cl. .............................. 345/76; 345/81; 345/82; 315/169.3

(58) Field of Classification Search .................. 345/36, 345/55–100, 204–207; 315/169.1, 169.3
See application file for complete search history.

(56) References Cited

U.S. PATENT DOCUMENTS

| | | | |
|---|---|---|---|
| 5,615,039 A | 3/1997 | Henley | |
| 5,659,332 A * | 8/1997 | Ishii et al. | 345/104 |
| 6,081,073 A | 6/2000 | Salam | |
| 6,144,162 A | 11/2000 | Smith | |
| 6,271,825 B1 | 8/2001 | Greene et al. | |
| 6,291,942 B1 | 9/2001 | Odagiri et al. | |
| 6,320,325 B1 * | 11/2001 | Cok et al. | 345/76 |
| 6,329,758 B1 * | 12/2001 | Salam | 345/83 |
| 6,356,029 B1 | 3/2002 | Hunter | |
| 6,392,617 B1 | 5/2002 | Gleason | |
| 6,404,137 B1 | 6/2002 | Shodo | |
| 6,414,661 B1 | 7/2002 | Shen et al. | |

(Continued)

FOREIGN PATENT DOCUMENTS

EP  0 923 067 A1  6/1998

(Continued)

OTHER PUBLICATIONS

Braun, D. et al., Transient response of passive matrix polymer LED displays, Synthetic Metals, 2001, 1747-1748, 121, Elsevier Science B.V.

(Continued)

*Primary Examiner*—David L. Lewis
(74) *Attorney, Agent, or Firm*—John H. Lamming

(57) ABSTRACT

A display for an electronic device may be calibrated and corrected for pixel-to-pixel variations in intensity. Radiation-sensing elements used for the calibration are not incorporated as circuit elements within the pixel circuits and may lie outside the pixels. Waveguides, reflectors, or the like may be used to optically couple the radiation-emitting elements of the pixels to the radiation-sensing elements. The radiation-sensing elements may be part of an apparatus separate from the electronic device or may be embedded within the electronic device. Many different methodologies may be used for correcting intensities to achieve better homogeneity in intensity among the pixels within a display.

13 Claims, 9 Drawing Sheets

U.S. PATENT DOCUMENTS

| | | | |
|---|---|---|---|
| 6,509,574 B2 * | 1/2003 | Yuan et al. | 250/551 |
| 7,002,546 B1 * | 2/2006 | Stuppi et al. | 345/102 |
| 7,064,733 B2 * | 6/2006 | Cok et al. | 345/76 |
| 7,164,417 B2 * | 1/2007 | Cok | 345/207 |
| 2001/0028060 A1 | 10/2001 | Yamazaki et al. | |
| 2001/0035848 A1 * | 11/2001 | Johnson et al. | 345/76 |
| 2001/0035853 A1 | 11/2001 | Hoelen et al. | |
| 2002/0030641 A1 | 3/2002 | Hack et al. | |
| 2003/0122749 A1 * | 7/2003 | Booth et al. | 345/82 |
| 2004/0174116 A1 * | 9/2004 | Lu et al. | 313/506 |
| 2005/0134171 A1 * | 6/2005 | Kobayashi | 313/504 |

FOREIGN PATENT DOCUMENTS

| | | |
|---|---|---|
| EP | 0 923 067 A1 | 6/1999 |
| EP | 0 966 018 A1 | 12/1999 |
| EP | 966018 A1 * | 12/1999 |
| EP | 1 079 361 A1 | 2/2001 |
| EP | 1 005 013 B1 | 7/2001 |
| EP | 1 134 719 A1 | 9/2001 |
| EP | 1 197 942 A2 | 4/2002 |
| EP | 1 204 088 A2 | 5/2002 |
| EP | 1 225 557 A1 | 7/2002 |
| EP | 1 194 013 B1 | 9/2003 |
| JP | 7-28427 | 1/1995 |
| JP | 8-16130 | 1/1996 |
| JP | 10-26959 | 1/1998 |
| JP | 2000-47639 A | 2/2000 |
| JP | 2000-122598 A | 4/2000 |
| JP | 2001-222259 A | 8/2001 |
| JP | 2001-236040 A | 8/2001 |
| JP | 2002-91378 A | 3/2002 |
| WO | WO 01/15232 A1 | 3/2001 |
| WO | WO 01/26087 A1 | 4/2001 |
| WO | WO 01/27910 A1 | 4/2001 |
| WO | WO 01/63587 A2 | 8/2001 |
| WO | WO 01/69583 A1 | 9/2001 |
| WO | WO 01/95301 A1 | 12/2001 |

OTHER PUBLICATIONS

Dawson, R. M. A. et al., A Poly-Si Active-Matrix OLED Display with Integrated Drivers, Society for Information Display 99 Digest, 1999, 438-441, 31.3.

Xiong, Shaozhen, et al., A Simple and Flexible Driver For OLED, Asian Symposium on Information Display '99, 147-150.

Hattori, Reiji et al., Current-Writing Active-Matrix Circuit for Organic Light-Emitting Diode Display Using a-Si:H Thin-Film-Transistors, IEICE Transactions on Electronics, May 2000, 779-782, vol. E83-C, No. 5.

Van De Biggelaar, Ton et al., Passive and active matrix addressed polymer light emitting diode displays, Proceedings of SPIE, 2001, 134-146, vol. 4295.

Dawson, R. M. A. et al., Design of an Improved Pixel for a Polysilicon Active-Matrix Organic LED Display, Society for Information Display 98 Digest, 1998, 11-14, 4.2.

\* cited by examiner

ORGANIC ELECTRONIC DEVICE HAVING IMPROVED HOMOGENEITY

FIELD OF THE INVENTION

This invention relates in general to electronic devices, and more particularly, to organic electronic devices comprising an array having radiation-emitting elements and methods of using them.

DESCRIPTION OF THE RELATED ART

Organic light-emitting diode and polymeric light-emitting diode (collectively, "OLED") technologies may be used for next generation flat-panel displays. An OLED device can be operated under constant current conditions. However, two lifetime effects are seen with OLEDs: (1) drift of electric characteristics and (2) intensity decrease.

One manifestation of lifetime effects for OLED technologies is related to extended operation of a stationary image that results in a burned-in pattern on the display, which reduces display quality considerably. The burned-in pattern corresponds to pixels having lower intensity emission when all pixels are operating at the same current because those burned-in pixels have been on disproportionately longer than other pixels in the display. Human eyes are extremely sensitive to light intensity variation, and therefore, variation of light intensity among pixels should be minimized. For example, an intensity variation of two percent translates to correct registration of 50 gray levels, which is close to 6-bit (i.e., $2^6$ or 64) digital grayscale. Note that uniformly increasing the current to all pixels to account for the overall intensity decrease does not address intensity differences among pixels in the same array.

Two approaches can be used to reduce the effects of burned-in image retention: (1) developing OLEDs with longer lifetimes (both light intensity and current-voltage stabilities) or (2) implementing a compensation mechanism in the display panel (e.g., pixel driver) or in peripheral driving electronics to drive each display pixel in a calibrated fashion that tries to maintain the display intensity homogeneity over the entire panel area. The former may require the development of new materials and is outside the scope of this specification. However, the latter may be accomplished with new circuitry.

One attempt to solve the problem includes a compensation approach that includes a series of amplifiers in parallel with the data driver (see, e.g., U.S. Patent Application Publication No. 2002/0030647). By probing the pixel current decay under a given voltage, the operation voltage of each pixel may be adjusted to its original current level. However, no compensation is provided for the intensity decrease related to constant current driving.

Another attempt to solve the problem, a photosensor thin-film transistor is incorporated into each pixel and detects the light being emitted at that pixel (see, e.g., U.S. Patent Application Publications No. 2001/0052597 and 2001/0055008). An electro-optic feedback system is created that can compensate for display intensity variation and degradation. However, the circuitry used for the OLED device is changed and may cause other complications. For example, the additional circuit element(s) within the pixel circuit may require a larger device, which is undesired.

In yet another attempt to solve the problem, a correction circuit using a current sensor or a photosensor may be used to adjust the voltage supplied to each display pixel to compensate for deterioration with time of the light output of each pixel (see, e.g., PCT Application Publication No. WO 98/40871). Similar to the photosensor thin-film transistor, the pixel circuit is changed and may cause other complications. For example, the additional circuit element(s) may require a larger device, which is undesired.

SUMMARY OF THE INVENTION

A display for an electronic device may be calibrated and corrected for pixel-to-pixel variations in intensity. Radiation-sensing elements used for the calibration are not incorporated as circuit elements within the pixel circuits and may lie outside the pixels. Waveguides, reflectors, or the like may be used to optically couple the radiation-emitting elements of the pixels to the radiation-sensing elements. The radiation-sensing elements may be part of an apparatus separate from the electronic device or may be embedded within the electronic device.

Many different methodologies may be used for correcting intensities to achieve better homogeneity in intensity among the pixels within a display. Using correction schemes of the invention, intensities of radiation emitted from nearby pixels in a display can be corrected to be within a range of approximately four percent of one another.

In one set of embodiments, an electronic device can comprise a first circuit comprising a radiation-emitting circuit element, and a second circuit comprising a radiation-sensing circuit element. The radiation-sensing element may not be part of the first circuit.

In another set of embodiments, an electronic device can comprise a radiation-emitting element lying within a pixel, and a radiation-sensing element for sensing radiation emitted from the radiation-emitting element. The radiation-sensing element may lie outside the pixel.

In still another set of embodiments, an electronic device can comprise a radiation-emitting element, a waveguide, and a radiation-sensing element. The waveguide can optically couple the radiation-emitting element to the radiation-sensing element.

In a further set of embodiments, a method of using an electronic device can comprise placing a radiation-sensing apparatus adjacent to a user side of the electronic device and activating radiation-emitting elements within an array. The method can also comprise measuring intensities of radiation emitted from the radiation-emitting elements. Measuring may be performed using the radiation-sensing apparatus. The method can further comprise removing the radiation-sensing apparatus away from the user side of the electronic device after measuring.

In still a further set of embodiments, a method of using an electronic device can comprise placing a reflector adjacent to a user side of the electronic device and activating radiation-emitting elements within an array. The method can also comprise measuring intensities of radiation emitted from the radiation-emitting elements. Measuring can be performed while the reflector is located adjacent to the user side of the electronic device. The method can further comprise removing the reflector away from the user side of the electronic device after measuring.

In yet another set of embodiments, a method of using an electronic device can comprise activating radiation-emitting elements within an array and measuring intensities of radiation emitted from the radiation-emitting elements during a most recent state. The method can also comprise determining correction factors for the radiation-emitting elements. The correction factor for a specific radiation-emitting element may be a function of (1) a change in intensity between a prior state and the most recent state of the specific radiation-emitting element, (2) a maximum change in intensity between the prior state and the most recent state of any radiation-emitting element in the array, (3) a maximum intensity of any radiation-emitting element in the array during the prior state, and (4) a minimum intensity of any radiation-emitting element in the array during the most recent state.

In another set of embodiments, a method of using an electronic device can comprise activating radiation-emitting elements within an array and measuring a calibration signal for the radiation-emitting elements during a most recent state. The method can also include determining correction factors for the radiation-emitting elements. The correction factor for a specific radiation-emitting element can be a function of the calibration signal. The method can further comprise determining data signals for the radiation-emitting elements. For each radiation-emitting element, the data signal can be a function of an input signal and the correction factor.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
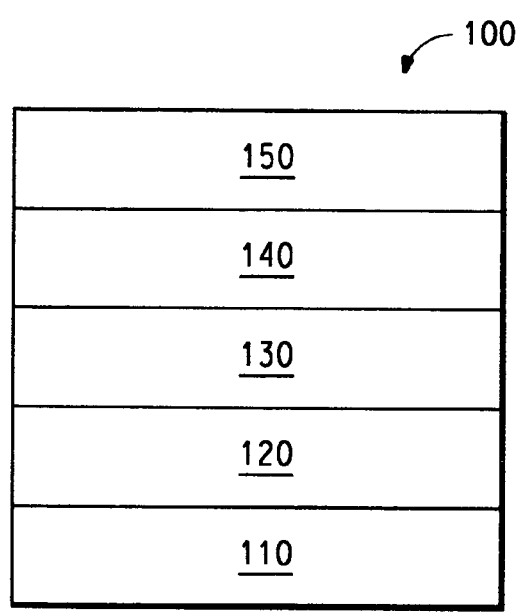
FIG. 1 includes a cross-sectional view of a portion of a radiation-emitting element.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

Reference is now made in detail to the exemplary embodiments of the invention, examples of which are illustrated in the accompanying drawings. Wherever possible, the same reference numbers will be used throughout the drawings to refer to the same or like parts (elements).

A display for an electronic device may be calibrated and corrected for pixel-to-pixel variations in intensity. Radiation-sensing elements used for the calibration are not incorporated as circuit elements within the pixel circuits and may lie outside the pixels. Waveguides, reflectors, or the like may be used to optically couple the radiation-emitting elements of the pixels to the radiation-sensing elements. The radiation-sensing elements may be part of an apparatus separate from the electronic device or may be embedded within the electronic device. Many different methodologies may be used for correcting intensities to achieve better homogeneity in intensity among the pixels within a display.

Before addressing details of embodiments described below, some terms are defined or clarified. As used herein, the terms "array," "peripheral circuitry" and "remote circuitry" are intended to mean different areas or components. For example, an array may include a number of pixels, cells, or other electronic devices within an orderly arrangement (usually designated by columns and rows) within a component. These electronic devices may be controlled locally on the component by peripheral circuitry, which may lie within the same component as the array but outside the array itself. Examples of peripheral circuits include column or row decoders, column or row array strobes, or the like. Remote circuitry typically lies within a different component and can send signals to or receive signals from the array (typically via the peripheral circuitry).

The term "circuit" is intended to mean a collection of circuit elements that collectively, when supplied the proper signal(s), perform a function. A circuit may include an active matrix pixel within an array of a display, a column or row decoder, a column or row array strobe, a sense amplifier, a signal or data driver, or the like. For the purposes of this specification, signal generators and power supplies that have signals sent to circuit elements may not be considered part of a circuit. For example, a data driver used to provide data to a pixel is not part of the pixel circuit, although the data driver has its own circuit. Likewise, a row array strobe used to activate a select (scan) line for a pixel is not part of the pixel circuit.

The term "circuit element" is intended to mean a lowest level unit of circuit that performs an electrical function. A circuit element may include a transistor, a diode, a resistor, a capacitor, or the like. A circuit element does not include parasitic resistance (e.g., resistance of a wire) or parasitic capacitance (e.g., capacitive coupling between two conductors connected to different circuit elements where a capacitor between the conductors is unintended or incidental).

The term "control electrode" is intended to mean an electrode used to control a transistor. In a field-effect transistor (e.g., junction field-effect transistor, metal-insulator-semiconductor field-effect transistor, etc.), the gate or gate electrode is the control electrode. In a bipolar transistor, the base or base region is the control electrode.

The term "coupled" is intended to mean a connection, linking, or association of two or more circuit elements, circuits, or systems in such a way that a potential or signal information may be transferred from one to another. Non-limiting examples of "coupled" can include direct connections between circuit elements, circuit elements with switch(es) (e.g., transistor(s)) connected between them, or the like.

The term "current-carrying electrode" is intended to mean an electrode used to carrying a current to or from a transistor. In a field-effect transistor (e.g., junction field-effect transistor, metal-insulator-semiconductor field-effect transistor, etc.), the source and drain (source region and drain region) are the current-carrying electrodes. In a bipolar transistor, the collector and emitter (collector region and emitter region) are the current-carrying electrodes.

The term "electron withdrawing" is synonymous with "hole injecting." Literally, holes represent a lack of electrons and are typically formed by removing electrons, thereby creating an illusion that positive charge carriers, called holes, are being created or injected. The holes migrate by a shift of electrons, so that an area with a lack of electrons is filled with electrons from an adjacent layer, which give the appearance that the holes are moving to that adjacent area. For simplicity, the terms holes, hole injecting, and their variants will be used.

The term "elevation" is intended to mean a plane substantially parallel to a reference plane. For electronic devices, the reference plane is typically the primary surface of a substrate. Elevations are typically used to note a distances from the primary surface.

The term "essentially X" is used to mean that the composition of a material is mainly X but may also contain other ingredients that do not detrimentally affect the functional properties of that material to a degree at which the material can no longer perform its intended purpose.

The term "low work function material" is intended to mean a material having a work function no greater than about 4.4 eV. The term "high work function material" is intended to mean a material having a work function of at least approximately 4.4 eV.

The term "pixel" is intended to mean the smallest complete unit of a display as observed by a user of the display. The term "subpixel" is intended to mean a portion of a pixel that makes up only a part, but not all, of a pixel. In a full-color display, a full-color pixel can comprise three sub-pixels with primary colors in red, green and blue spectral regions. A desired color can be obtained by combining the three primary colors with different intensities (gray levels). For instance, with 8-bit (256 level) gray levels for each sub-pixel, one can achieve $8^3$ or approximately 16.7 million color combinations. However, a red monochromatic display may only include red light-emitting elements. In the red monochromatic display, each red light-emitting element resides in a pixel. No subpixels are needed. Therefore, whether a light-emitting element is a pixel or subpixel depends on the application in which it is used.

The term "nearby pixels" is intended to refer to a relationship between a first pixel and the surrounding pixels in the plane of a display matrix. Nearby pixels are those that are approximately within a 25×25 pixel matrix wherein the first pixel is located at the center of the matrix.

The term "primary surface" is intended to mean a surface of a substrate from which an electronic device is subsequently formed.

The term "state" is intended to refer to information used for calibration factors at a point in time. For example, the first time an electronic device is calibrated may be an initial state. The second time the electronic device is calibrated may be the most recent state until the next calibration, and the initial state is now the prior state. A third calibration may include data collected for a most recent state, and information collected during the second calibration may now be the prior state.

The term "user side" of an electronic device refers to a side of the electronic device adjacent to a transparent electrode and principally used during normal operation of the electronic device. In the case of a display, the side of the electronic device having the display would be a user side. In the case of a detector or voltaic cell, the user side would be the side that principally receives radiation that is to be detected or converted to electrical energy.

The term "organic electronic device" is intended to mean a device including one or more semiconductor layers or materials. Organic electronic devices include: (1) devices that convert electrical energy into radiation (e.g., a light-emitting diode, light-emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy (e.g., a photovoltaic device or solar cell), and (4) devices that include one or more electronic components that include one or more organic semi-conductor layers (e.g., a transistor or diode).

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the periodic table of the elements use the "New Notation" convention as seen in the *CRC Handbook of Chemistry and Physics*, $81^{st}$ Edition (2000).

To the extent not described herein, many details regarding specific materials, processing acts, and circuits are conventional and may be found in textbooks and other sources within the organic light-emitting display, photodetector, semiconductor and microelectronic circuit arts. Details regarding radiation-emitting elements, pixels, subpixels, and pixel and subpixel circuitry will be addressed before turning to details of the radiation-sensing elements and circuitry.

FIG. 1 includes an illustration of a cross-sectional view of a radiation-emitting element 100 that can be used in electronic devices described herein. The radiation-emitting element 100 is typically a light-emitting element that has an emission maximum within the visible light spectrum (wavelengths in a range of 400-700 nm). As shown in FIG. 1, the radiation-emitting element can comprise an anode layer 110, a cathode layer 150, and an active layer 130. Adjacent to the anode layer 110 is an optional hole-injecting/transport layer 120, and adjacent to the cathode layer 150 is an optional electron-injection/transport layer 140. Layers 120 and 140 are examples of charge transport layers.

The radiation-emitting element 100 may be part of an electronic device and may be formed over a support or substrate (not shown) adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed-metal oxide. Suitable metal elements within the anode layer 110 can include the Groups 4, 5, 6, and 8-11 transition metals. If the anode layer 110 is to be light transmitting, mixed-metal oxides of Groups 12, 13 and 14 metals, such as indium-tin-oxide, may be used. Some non-limiting, specific examples of materials for anode layer 110 include indium-tin-oxide ("ITO"), aluminum-tin-oxide, gold, silver, copper, nickel, and selenium.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering (e.g., ion beam sputtering), e-beam evaporation, and resistance evaporation. Specific forms of physical vapor deposition include rf magnetron sputtering or inductively-coupled plasma physical vapor deposition ("ICP-PVD"). These deposition techniques are well known within the semiconductor fabrication arts.

A hole-transport layer 120 may be adjacent the anode. Both hole transporting small molecule compounds and polymers can be used. Commonly used hole transporting molecules, in addition to N,N'-diphenyl-N,N'-bis (3-methylphenyl)-[1,1'-biphenyl]-4,4'-diamine (TPD) and bis[4-(N,N-diethylamino)-2-methylphenyl](4-methylphenyl)methane (MPMP), include: 1,1-bis[(di-4-tolylamino) phenyl]cyclohexane (TAPC); N,N'-bis(4-methylphenyl)-N,N'-bis (4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); a-phenyl-4-N,N-diphenylaminostyrene (TPS); p-(diethylamino)benzaldehyde diphenylhydrazone (DEH); triphenylamine (TPA); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); and porphyrinic compounds, such as copper phthalocyanine. Commonly used hole transporting polymers are polyvinylcarbazole, (phenylmethyl)polysilane, poly(3,4-ethylendioxythiophene) (PEDOT), and polyaniline. Hole-transporting polymers can be obtained by doping hole-transporting molecules such as those mentioned above into polymers, such as polystyrene and polycarbonate.

The hole-injection/transport layer 120 can be formed using any conventional means, including spin-coating, casting, and printing, such as gravure printing. The layer can also be applied by ink jet printing, thermal patterning, or chemical or physical vapor deposition.

Usually, the anode layer 110 and the hole-injection/transport layer 110 are patterned during the same lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet-chemical or dry-etching techniques. Other processes for patterning that are well known in the art can also be used. When the electronic devices are located within an array, the anode layer 110 and hole injection/transport layer 110 typically are formed into substantially parallel strips having lengths that extend in substantially the same direction.

The organic active layer 130 can comprise small molecule materials or polymeric materials. Small molecule materials may include those described in, for example, U.S. Pat. No. 4,356,429 ("Tang") and U.S. Pat. No. 4,539,507 ("Van Slyke"), the relevant portions of which are incorporated herein by reference. Alternatively, polymeric materials may include those described in U.S. Pat. No. 5,247,190 ("Friend"), U.S. Pat. No. 5,408,109 ("Heeger"), and U.S. Pat. No. 5,317,169 ("Nakano"), the relevant portions of which are incorporated herein by reference. Exemplary materials are semiconductive conjugated polymers. An example of such a polymer is poly (phenylenevinylene) referred to as "PPV." The light-emitting materials may be dispersed in a matrix of another material, with and without additives, but typically form a layer alone. The organic active layer 130 may comprise a semiconductive conjugated polymers and electro- and photo-luminescent materials. Specific examples include, but are not limited to, poly(2-methoxy,5-(2-ethyl-hexyloxy)-1,4-phenylene vinylene) ("MEH-PPV") and MEH-PPV composites with CN-PPV.

An organic active layer 130 containing the organic active material can be applied from solution using a conventional means, including spin-coating, casting, and printing. The organic active materials can be applied directly by vapor deposition processes, depending upon the nature of the materials. An active polymer precursor can be applied and then converted to the polymer, typically by heating.

Optional layer 140 can function both to facilitate electron injection/transport, and also serve as a buffer layer or confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, $Li_2O$, or the like.

The electron injection/transport layer 140 can be formed using any conventional means, including spin-coating, casting, and printing, such as gravure printing. The layer can also be applied by ink jet printing, thermal patterning, or chemical or physical vapor deposition.

The cathode layer 150 is an electrode that is particularly efficient for injecting electrons or negative charge carriers. The cathode layer 150 can be any metal or nonmetal having a lower work function than the first electrical contact layer (in this case, the anode layer 110). Materials for the second electrical contact layer can be selected from alkali metals of Group 1 (e.g., Li, Na, K, Rb, Cs,), the Group 2 (alkaline earth) metals, the Group 12 metals, the rare earths, the lanthanides (e.g., Ce, Sm, Eu, or the like), and the actinides. Materials, such as aluminum, indium, calcium, barium, yttrium, and magnesium, and combinations thereof, may also be used. Li-containing organometallic compounds, LiF, and $Li_2O$ can also be deposited between the organic layer and the cathode layer to lower the operating voltage. Specific non-limiting examples of materials for the cathode layer 150 include barium, lithium, cerium, cesium, europium, rubidium, yttrium, magnesium, or samarium.

The cathode layer 150 is usually formed by a chemical or physical vapor deposition process. The cathode layer can be patterned, as discussed above in reference to the anode layer 110 and optional hole-injecting layer 120. If the device lies within an array, the cathode layer 150 may be patterned into substantially parallel strips, where the lengths of the cathode layer strips extend in substantially the same direction and substantially perpendicular to the lengths of the anode layer strips. Electronic elements called radiation-emitting elements are formed at the cross points (where an anode layer strip intersects a cathode layer strip when the array is seen from a plan or top view). Alternatively, in the case of an active matrix display, the cathode layer can be an unpatterned common cathode layer that covers the entire pixel array. In this case, it is the patterned anode layer that defines the location and boundary of individual radiation-emitting elements.

In other embodiments, additional layer(s) may be present within organic electronic devices. For example, a layer (not shown) between the hole-injecting layer 120 and the active layer 130 may facilitate positive charge transport, band-gap matching of the layers, function as a protective layer, or the like. Similarly, additional layers (not shown) between the electron-injecting layer 140 and the cathode layer 150 may facilitate negative charge transport, band-gap matching between the layers, function as a protective layer, or the like. Layers that are known in the art can be used. Some or all of the layers may be surface treated to increase charge carrier transport efficiency. The choice of materials for each of the component layers may be determined by balancing the goals of providing a device with high device efficiency with the cost of manufacturing, manufacturing complexities, or potentially other factors.

Each functional layer may be made up of more than one layer. For example, the cathode layer may comprise a layer of a Group 1 metal and a layer of aluminum. The Group 1 metal may lie closer to the active layer 130, and the aluminum may help to protect the Group 1 metal from environmental contaminants, such as water.

Although not meant to limit, the different layers may have the following range of thicknesses: inorganic anode layer 110, usually no greater than approximately 500 nm, for example, approximately 50-200 nm; optional hole-injecting layer 120, usually no greater than approximately 100 nm, for example, approximately 50-200 nm; active layer 130, usually no greater than approximately 100 nm, for example, approximately 10-80 nm; optional electron-injecting layer 140, usually no greater than approximately 100 nm, for example, approximately 10-80 nm; and cathode layer 150, usually no greater than approximately 1000 nm, for example, approximately 30-500 nm. If the anode layer 110 or the cathode layer 150 needs to transmit at least some light, the thickness of such layer may not exceed approximately 100 nm.

In the radiation-emitting element 100, electrons and holes, injected from the cathode 150 and anode 110 layers, respectively, into the photoactive layer 130, form negative and positively charged polarons in the active layer 130. These polarons migrate under the influence of the applied electric field, forming a polaron exciton with an oppositely charged species and subsequently undergoing radiative recombination. A sufficient potential difference between the anode and cathode, usually less than approximately 20 volts, and in some instances no greater than approximately 5 volts, may be applied to the radiation-emitting element. The actual potential difference may depend on the use of the radiation-emitting element in a larger electronic component. In many embodiments, the anode layer 110 is biased to a positive voltage and the cathode layer 150 is at substantially ground potential or zero volts during the operation of the electronic device. In another embodiment, the cathode layer 150 may be biased using a negative potential.

Figure 2:
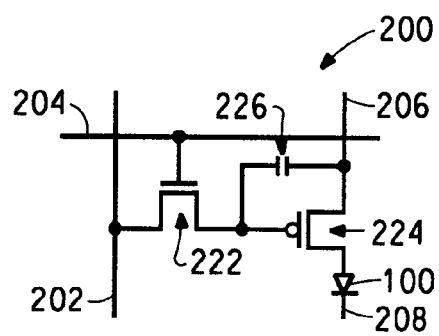
FIG. 2 includes a schematic diagram of an active-matrix OLED.
Figure 3:
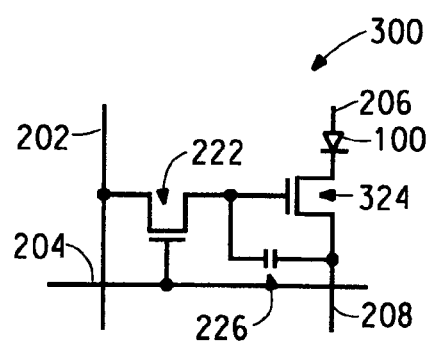
FIG. 3 includes a schematic diagram of an alternative active-matrix OLED.

The radiation-emitting element 100 may be part of a passive matrix or array or an active matrix or array. For a passive matrix, the radiation-emitting element 100 may be the pixel circuit. FIGS. 2 and 3 show exemplary pixel circuits for an electronic device with an active matrix display. After reading this specification, skilled artisans appreciate that many other pixels circuits may be used. When a pixel has one radiation-emitting element, the pixel may be used for a monochromatic display.

In FIG. 2, each pixel includes an n-channel transistor 222, a capacitor 226, a p-channel transistor 224, and the radiation-emitting element 100. The source of the n-channel transistor 222 is connected to the data line 202. The drain of the n-channel transistor 222 is connected to an electrode of the capacitor 226 and the gate of the p-channel transistor 224. The other electrode of the capacitor 224 is connected to the source of the p-channel transistor 224 and the Vdd line 206. The drain of the p-channel transistor 224 is connected to the anode of the light-emitting element 100. The cathode of the light-emitting element 100 is connected to the Vss line 208. All circuit elements in FIG. 2 except for the light-emitting element 100 form the pixel driver for that pixel circuit.

FIG. 3 is similar to FIG. 2 with a few exceptions. The p-channel transistor 224 is replaced by a second n-channel transistor 324. The other electrode for capacitor 226 is connected to the source of the second n-channel transistor 324 and the Vss line 208 instead of the Vdd line 206. The radiation-emitting element 100 has its anode connected to the Vdd line 206 and its cathode to the drain of the second n-channel transistor 324.

Figure 4:
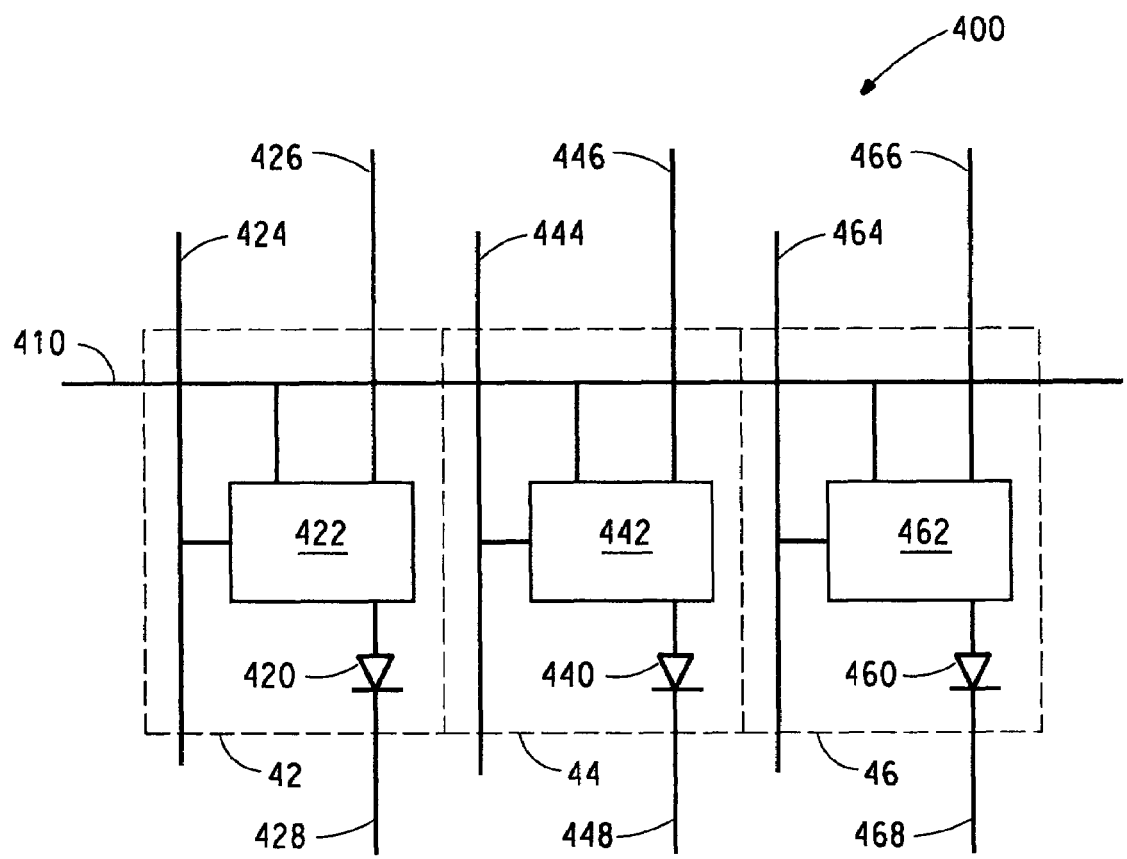
FIG. 4 includes a schematic diagram of a full-color active-matrix pixel.

Either type of pixel circuit shown in FIG. 2 or 3 may be used in a full-color display. FIG. 4 includes a pixel 400 that includes a red subpixel 42, a green subpixel 44, and a blue subpixel 46. Each subpixel includes a light-emitting element (420, 440, 460) and a subpixel driver (422, 442, 462). Each of the subpixel drivers has the pixel driver circuit as described with respect to FIG. 2. Each of the subpixels (42, 44, 46) is connected to a common select (scan) line 410, a data line (424, 444, 4646), a Vdd line (426, 446, 466), and a Vss line (428, 448, 468). The potentials for the Vdd lines 426, 446, and 466 may be the same or different for the subpixels 42, 44, and 46. Similarly, the potentials for the Vss lines 428, 448, and 468 may be the same or different for the subpixels 42, 44, and 46. In an alternative embodiment, the pixel circuit 300 as shown in FIG. 3 could be used as a building block for the subpixel circuit. In that embodiment, the light-emitting element for a subpixel would lie between the Vdd line and subpixel driver for that subpixel.

As used in the subsequent figures, any of the pixels described in FIGS. 2-4 may be used. Each of the pixels will be represented by a block to simplify understanding of the embodiments described herein. In a display, the pixels can lie within an array. A two-dimensional array or matrix may be used to communicate information to a user of an electronic device. A focus of this specification is to improve homogeneity between radiation-emitting elements within an array without changing the pixel or subpixel circuit.

FIGS. 5-11 include illustrations of electronic devices and radiation-sensing elements used for calibrating displays of those devices. Calibrating systems may include radiation-sensing elements, waveguides, reflectors, or any combination thereof. The radiation-sensing elements, waveguides, reflectors, or any combination thereof may be part of a separate apparatus or embedded within the electronic device. The calibrating systems are better understood as described in more detail in FIGS. 5 through 11.

Figure 5:
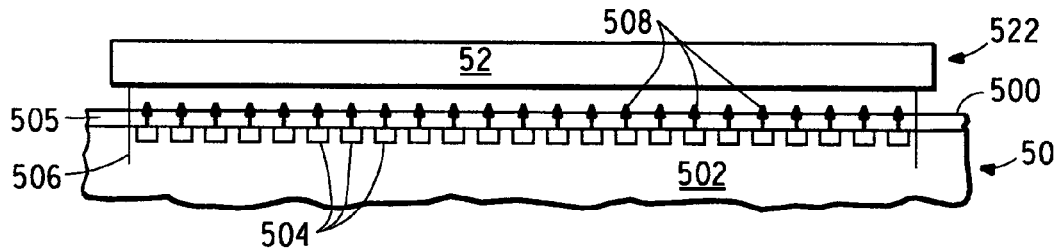
FIG. 5 includes an illustration of a cross-sectional view of portions of an array of pixels and a radiation-sensing element.

FIG. 5 includes an illustration of a cross-sectional view of a calibrating system that includes an electronic device 50 and a separate radiation-sensing element, such as photosensor 52. The electronic device can include a passivation layer or protective shield 502 and an array that is oriented in rows and columns of pixels 504. Each of the pixels 504 can emit radiation as illustrated by arrows 508 in FIG. 5. Dashed lines 506 represent edges of the array. A substrate 505 overlies the protective shield 502 and pixels 504. The protective shield 502 can protect the pixels 504 and other electronic circuits, if any, from environmental hazards or other conditions (e.g., scratches, moisture, mobile ions, other contamination, or the like). The electronic device 50 has a user side 500. Note that the radiation-emitting element 100 as illustrated in FIG. 1 may be oriented such that radiation can emit through the anode layer 110 and be seen by a user of the electronic device 50.

The photosensor 52 may be placed in contact with or otherwise adjacent to the user side 500. Notice that the photosensor 52 may be the same size or larger than the array because its edges 522 extend beyond the edges 506 of the array. The photosensor 52 may be a conventional photodiode or photosensitive transistor that may include a p-n junction. Although not shown, electrical connections and a sense amplifier may be connected to the photodiode. During calibration, typically one pixel 504 at a time will be activated with its light intensity measured by the radiation-sensing element, which is shown as photosensor 52 in FIG. 5.

Figure 6:
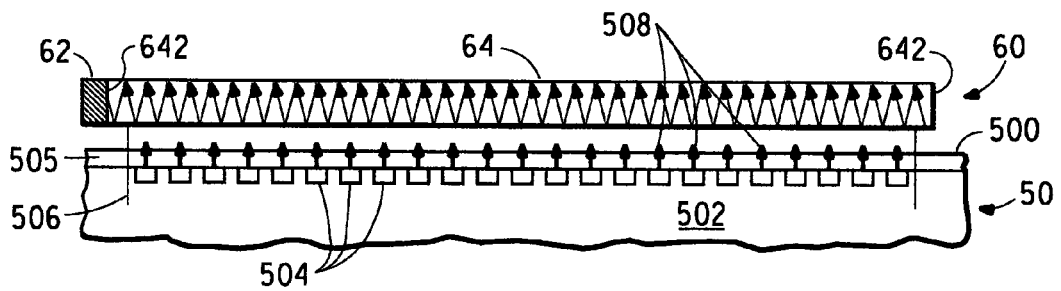
FIG. 6 includes an illustration of a cross-sectional view of portions of an array of pixels, a radiation-sensing element, and a waveguide.

FIG. 6 includes an illustration of a cross-sectional view of an alternative calibrating system. The apparatus 60 can be used to measure the intensity of radiation 508 from the pixels 504. Similar to FIG. 5, the apparatus 60 may be placed in contact with or otherwise adjacent to the user side 500 of the electronic device 50. In this embodiment, the apparatus 60 may include a photosensor 62 and a waveguide 64. The edges 642 of the waveguide 64 are adjacent to and extend beyond the edges 506 of the array. The waveguide 642 can include a material of relatively higher refractive index surrounded by a material of relatively lower refractive index. In one example, a quartz (i.e., silicon dioxide) block having a refractive index of approximately 1.45 may be surrounded by air having a refractive index of approximately 1.0. Alternatively, a block of silicon nitride (refractive index of approximate 2.0), polyethylene napthalate (refractive index in a range of approximately 1.65-1.90), polyimide (refractive index of approximately 1.5-1.7), or other materials could be used. Note that the refractive indices may vary depending on the composition of the material (including crystalinity or lack thereof) and the wavelength of radiation. The numbers for refractive indices are given to illustrate the general construction of a waveguide. The photosensor 62 is connected to one of the edges 642 of the waveguide 64. The waveguide 64 optically couples the pixels 504, each having a radiation-emitting element, to the radiation-sensing element 62. Similar to the system shown in FIG. 5, the pixels 504 are typically activated one at a time during a calibration operation.

Figure 7:
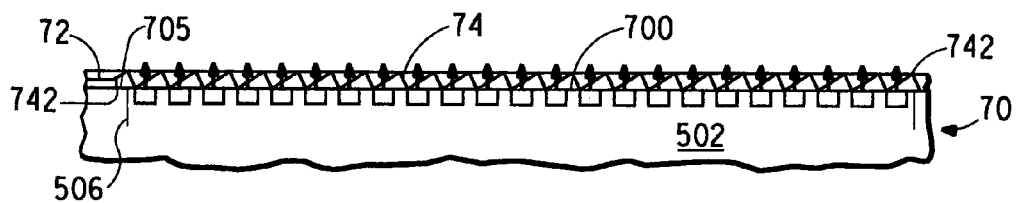
FIG. 7 includes an illustration of a cross-sectional view of portion of an electronic device that comprises an array of pixels, a waveguide, and a photodetector.

FIG. 7 includes an illustration of a cross-sectional view of an electronic device 70 having an embedded calibrating system. The electronic device 70 may have a modified substrate 705, wherein a portion of the substrate can act as a waveguide 74. A photosensor 72 may lie within the substrate 705. A combination of the substrate 705 and air on the user side 700 of the electronic device 70 can act as a waveguide. Unlike the embodiments of FIGS. 5 and 6, the waveguide 74 does not have specific boundaries. Still, the effective edges of the waveguide 74 may correspond to portions of the substrate 705 extending from the photosensor 72 to a location at or just beyond the array edge 506 opposite the photosensor 72.

The photosensor 72 can be part of a sensing circuit, separate from the pixel (or subpixel) circuit. In other words, the photosensor 72 may not be part of the pixel (or subpixel) circuit. Further, the photosensor 72 and sensing circuit may not be electrically connected or, in some embodiments, coupled to the pixel (or subpixel) circuit. The connections and circuit elements for the sensing circuit and photosensor 72 are conventional.

Fabrication of portions of the electronic device 70 is briefly addressed. The substrate 705 may include conventional material(s) having conventional thickness(es). A location for the photosensor 72 may be etched into the substrate 705. The photosensor 72 may be formed by plasma-enhanced chemical vapor deposition or physical vapor deposition of a silicon material. In one embodiment, n-type and p-type doping may be performed in-situ during a portion of the deposition, may be performed subsequent to the deposition, or a combination thereof. A polishing operation may be used to remove the silicon material lying outside the recession within the substrate 705. A user of the electronic device 70 will see the user side 700. Other fabrication methods or sequences can be performed. For example, a deposition and etch process may be used. An electrically insulating material may be formed after forming the photosensor 72.

Figure 8:
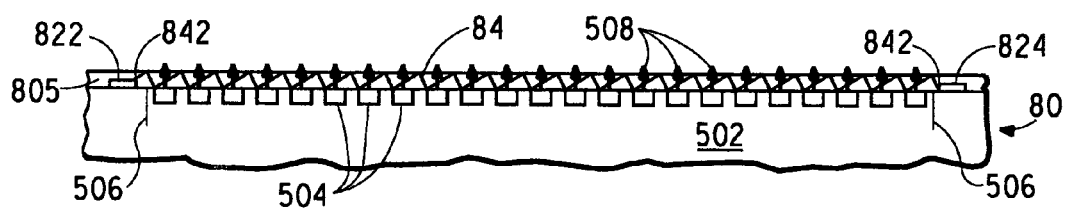
FIGS. 8 and 9 include illustrations of a cross-sectional view and a plan view, respectively, of portions of an electronic device that comprises an array of pixels, a waveguide, and photodetectors along edges of the waveguide.
Figure 9:
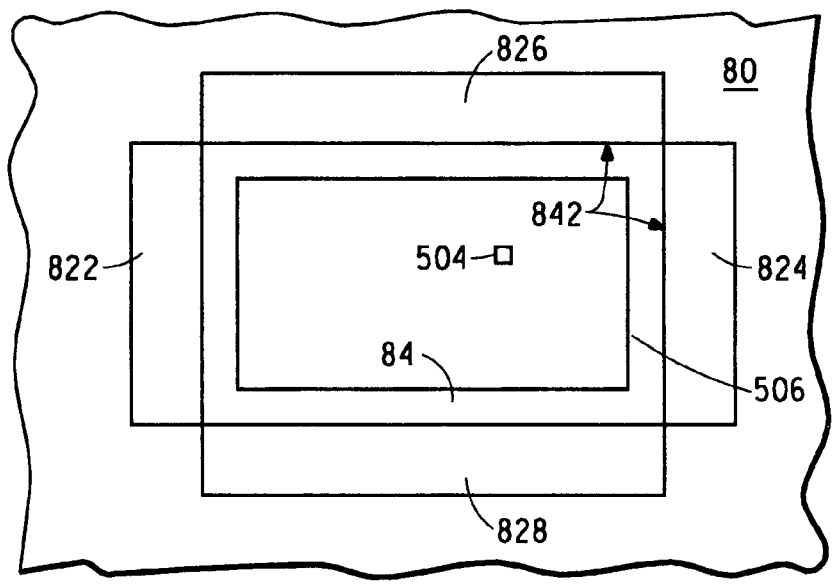

FIGS. 8 and 9 include an alternative embodiment similar to FIG. 7 except that the electronic device 80 includes a plurality of photosensors 822, 824, 826, and 828. Referring to FIG. 8, the photosensors 822 and 824 lie along opposite edges 842 of a waveguide 84. In this embodiment, the edges 842 of the waveguide 84 are better defined and can be that portion of the substrate 805 surrounded by the photosensors 822, 824, 826, and 828. The compositions of the substrate 805 and waveguide 84 may be the same or different from those describe with respect to FIG. 7. During a calibration operation, the pixels 504 can be activated one at a time. During regular operation, a plurality of pixels 504 may have light 508 emitted that passes through the substrate 805 and waveguide 84.

FIG. 9 includes a plan view of the electronic device 80 to better illustrate the positional relationships of some of the features of the device. The edges of the array are illustrated by dashed line 506 and generally correspond to the shape of a display for the electronic device 80. Although FIG. 9 shows one pixel 504, the array includes a plurality of pixels 504. Each pixel 504 may be designated by x- and y-coordinates. The waveguide 84 has edges 842 that have corresponding edges 506 in the array. The photosensors 822, 824, 826, and 828 are connected to the edges 842 of the waveguide 84.

In this particular environment, a pixel 504 lies closer to photosensor 824. Light emitted by the pixel 504 may be detected by the four photosensors, and more strongly detected by photosensor 824 compared to photosensor 822. The system illustrated in FIGS. 8 and 9 may have more accurate correction factors compared to the embodiment illustrated in FIG. 7 that has only one photosensor 72. When using signals from the photosensors in FIGS. 8 and 9, a detected composite signal for each pixel 504 may be a sum of all intensities measured by the photosensors, a product of those intensities, an average of those intensities, a geometric mean of those intensities, or the like.

Figure 10:
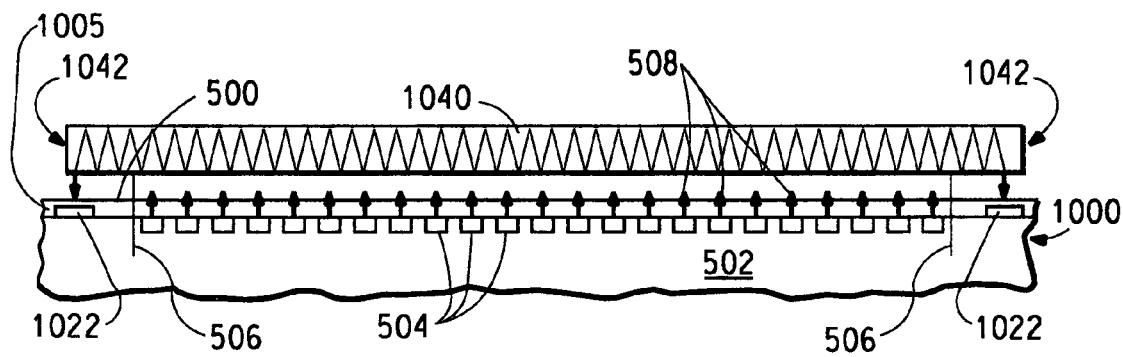
FIG. 10 includes an illustration of a cross-sectional view of portions of a waveguide and an electronic device that comprises an array of pixels and photodiodes near the edges of the array.

FIG. 10 includes an illustration of a hybrid calibrating system. In this particular embodiment, the electronic device 1000 can include pixels 504, photosensors 1022, and a protective shield 502. A waveguide 1040 has edges 1042 extending at least to the photosensors 1022. The waveguide 1040 may be similar to the waveguide 64 in its composition. It may also be used in a similar manner. However, unlike the system shown in FIG. 6, the photosensors 1022 are embedded within the electronic device 1000, more specifically in the substrate 1005, as opposed to a separate apparatus. During calibration, light 508 from a pixel 504 may travel along the waveguide 1040 until it reaches the sensors 1022.

Figure 11:
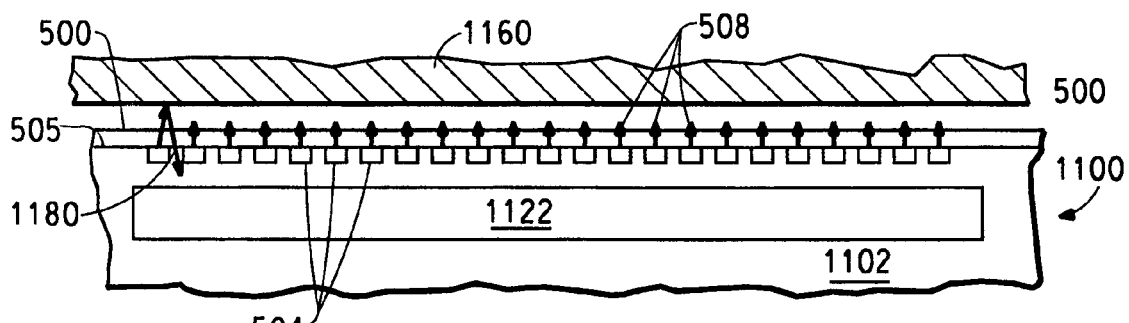
FIG. 11 includes an illustration of a cross-sectional view of portions of a reflector and an electronic device that comprises an array of pixels and a buried photodetector.

FIG. 11 includes an illustration of yet another hybrid calibrating system. An electronic device 1100 may include a photosensor 1122 that is buried within a passivation layer or protective shield 1102. During fabrication, the protective shield 1102 may be formed after the pixels 504 have been formed along the substrate 505. During a calibration operation, a reflector 1160 may be placed over the array. Light 508 from a pixel 504 may be reflected by a reflector 1160 to the photosensor 1122. The reflected light is illustrated by arrow 1180. In yet another alternative environment (not shown), a combination of a waveguide and photosensor(s) similar to those shown in FIGS. 7-9 may be embedded within the protective shield 1102 at location below the array.

Fabrication of the protective shield 1102 is briefly addressed. After forming the pixels 504, a first portion of the protective shield 1102 may be formed over the substrate 505 and pixels 504. The photosensor 1122 may be formed by plasma-enhanced chemical vapor deposition or physical vapor deposition of a silicon material. The appropriate n-type and p-type doping may be performed in-situ during a portion of the deposition, may be performed subsequent to the deposition, or a combination thereof. An etching operation may be used to pattern the photosensor 1122. Another layer of the shielding material can be formed over the photosensor 1122 to complete formation of the protective shield 1102. A user of the electronic device 1100 will see the user side 500.

If a waveguide and photosensor(s) are to be formed (not shown in FIG. 11) in place of the photosensor 1122, the fabrication may be different. After forming the pixels 504, a first portion of the protective shield 1102 may be formed over the substrate 505 and pixels 504. The material for the waveguide may be formed by plasma-enhanced chemical vapor deposition or physical vapor deposition of a silicon nitride material. The silicon nitride material may be subsequently patterned to form the waveguide. The photosensor may be formed by plasma-enhanced chemical vapor deposition or physical vapor deposition of a silicon material. The appropriate n-type and p-type doping may be performed in-situ during a portion of the deposition, may be performed subsequent to the deposition, or a combination thereof. A polishing operation may be used to remove the silicon material overlying the waveguide. Subsequent patterning may be performed to form the outer side edges of the sensor(s) (edges other than one that contacts the waveguide). Another portion of the protective shield can be formed over the photosensor(s) and waveguide to complete formation of the protective shield layer. In an alternative method, the photosensor may be formed before forming the waveguide.

Other fabrication methods or sequences can be performed. For example, the waveguide and photosensor(s) may be fabricated within a protective shield separate from the pixels 504. The shield with the embedded waveguide and photosensor(s) may be later attached to the substrate 505. In this matter, the formation conditions for the waveguide and photosensor(s) may not be limited to conditions set by materials used within the pixels 504, such as materials used within their radiation-emitting elements 100. In still another alternative embodiment, other materials may be used for the waveguide. Some of the materials for waveguides have been previously described.

In another alternative embodiment (not shown), the anodes and cathodes of the radiation-emitting elements may be transparent to the radiation emitted from the pixels 504. In this embodiment, a reflector may not be needed, and the photosensor or photosensor/waveguide combination may not lie between the pixels 504 and the user side 500 of the electronic device 1100.

In other embodiments (not shown), the photosensor 52 or 1122 may comprise a series of photosensors oriented in rows or columns. In still another alternative electronic device (not shown), each pixel 504 made have its own corresponding photosensor. One or both electrodes to the photosensor may be transparent when each pixel includes a radiation-emitting and corresponding radiation-sensing element. As the number of photosensors increases, the number of circuits and other electrical connections may also increase the complexity or cost of the design. After reading this specification, skilled artisans will be able to determine what radiation-sensing configuration fits their needs.

EXAMPLES

The following specific examples are meant to illustrate and not limit the scope of the invention.

Example 1

Example 1 shows that the configuration as illustrated in FIG. 5 can be used to measure radiation intensity for a 10×10 passive-matrix OLED display. The photodiode 52 can be placed near pixels 504. In this example, each display pixel can be turned on sequentially. Light from a pixel 504 at coordinates x and y can be received by the photodiode 52 and converted to an electrical signal. The value of the signal from the photodiode may have a corresponding potential, $V_0(x,y)$. An advantage of this method is that the signal from the photodiode can be independent of each pixel's position. Because the photodiode 52 may contact the user side 500 of the electronic device 50, acceptable signal level can be obtained without any significant complication. The signal generated by the photodiode 52 may only depend on the actual light intensity of each pixel under certain operating voltages.

Table 1 includes exemplary data from different pixels (Pixel 1, 5, and 9) under different driving current conditions ($i_{LED}$). In Table 1, the output current from the photodiode 52 is shown for each pixel listed.

TABLE 1

| $i_{LED}$ (µA) | Pixel 1 $i_{PD}$ (µA) | Pixel 5 $i_{PD}$ (µA) | Pixel 9 $i_{PD}$ (µA) |
| --- | --- | --- | --- |
| 10 | −0.18 | −0.148 | −0.19 |
| 20 | −0.4 | −0.332 | −0.42 |
| 40 | −0.86 | −0.723 | −0.9 |
| 60 | −1.31 | −1.11 | −1.38 |
| 80 | −1.73 | −1.49 | −1.8 |
| 100 | −2.15 | −1.86 | −2.23 |

Example 2

Example 2 shows that the configuration as illustrated in FIG. 6 can be used to measure radiation intensity for a 10×10 passive-matrix OLED display. The apparatus 60 can be placed on the user side 500 of the display of the electronic device 50. The system can be operated in a manner similar to Example 1. An advantage of this method is that no large photodiode is required, and the read-out process may be significantly quicker than the method in Example 1. The optical waveguide may be similar to that used for backlight in liquid crystal displays in laptop computers. Such an optical waveguide is known to skilled optical engineers. The measured signal can be a function of pixel location. The further the pixel is from the photodetector, the smaller the measured signal is.

Table 2 includes exemplary data from different pixels (Pixel 1, 5, and 9) under different driving current conditions ($i_{LED}$). In Table 2, output current from the photodiode 62 is shown for each pixel listed.

TABLE 2

| $i_{LED}$ (µA) | Pixel 1 $i_{PD}$ (nA) | Pixel 5 $i_{PD}$ (nA) | Pixel 9 $i_{PD}$ (nA) |
| --- | --- | --- | --- |
| 10 | −3 | −1.8 | −2.7 |
| 20 | −6 | −4.4 | −6.15 |
| 40 | −11.7 | −9 | −11.5 |
| 60 | −16.7 | −13.5 | −17.5 |
| 80 | −21 | −18 | −24 |
| 100 | −25.5 | −22.5 | −30.5 |

Example 3

Example 3 shows that the configuration as illustrated in FIG. 7 can be used to measure radiation intensity for a 10×10 passive-matrix OLED display. A small portion of the light output from each pixel's emission can be transmitted to the sensor 72 through the waveguide portion 74 of the substrate 705. In this method, each pixel can be turned on sequentially. The advantage of this method is that the photodiode can be integrated onto the same substrate as the display, which can simplifies the module system. This approach should have sufficient optical waveguiding and low self-absorption of the light by the light-emitting material.

Table 3 includes exemplary data from different pixels (Pixel 1, 5, and 9) under different driving current conditions ($i_{LED}$). In Table 3, the output current from the photosensor 72 is shown for each pixel listed.

TABLE 3

| $i_{LED}$ (µA) | Pixel 1 $i_{PD}$ (nA) | Pixel 5 $i_{PD}$ (nA) | Pixel 9 $i_{PD}$ (nA) |
| --- | --- | --- | --- |
| 10 | −1.5 | −0.5 | −0.5 |
| 20 | −3.5 | −1.4 | −1 |
| 40 | −7.4 | −3 | −2 |
| 60 | −10.5 | −4.7 | −3 |
| 80 | −14 | −6.5 | −4.2 |
| 100 | −17.5 | −8 | −5.2 |

Example 4

Example 4 shows that the configuration as illustrated in FIGS. 8 and 9 can be used to measure radiation intensity for a 10×10 passive-matrix OLED display. The signal measured for each pixel may depend on the position of each pixel. The further the pixel lies from a specific photodetector, the smaller the signal becomes. The light intensity from a pixel near an edge of a waveguide opposite the photosensor may be difficult to measure. See the configurations shown in FIGS. 6 and 7. To improve the signal and reduce the signal variation among different locations, four photodiodes 822, 284, 826, and 828 lie along each side of the display panel as illustrated in FIGS. 8 and 9.

Assume the dimensions of the display for device 80 are L×W, and the light intensity of a pixel 504 with position (x,y) measured by photodiode 822 may be governed by $I = I^0 e^{-\alpha x}$ (assuming the optical signal loss is exponentially dependent on distance between the pixel and the sensing photodiode). By adding the other three photodiodes (824, 826, and 828) to the device, the light intensity collected by all the photodiodes becomes:

$$I_{x,y} = I_{822} + I_{824} + I_{826} + I_{828} = I_0 e^{-\alpha x} + I_0 e^{-\alpha y} + I_0 e^{-\alpha(L-x)} + I_0 e^{-\alpha(W-y)},$$

wherein:

$I_{x,y}$ is the calculated intensity as measured by the photosensors;

$I_{822}$ is the intensity as measured by photosensor 822;

$I_{824}$ is the intensity as measured by photosensor 824;

$I_{826}$ is the intensity as measured by photosensor 826;

$I_{828}$ is the intensity as measured by photosensor 828; and $I_0$ is a constant.

Example 5

Example 5 shows that the configuration as illustrated in FIG. 11 can be used to measure radiation intensity for a 10×10 passive-matrix OLED display. The emitting light from the pixels 504 can be reflected by an optical reflector (mirror) plate 1160 back to the display panel and through a transparent area between display pixels down to the surface of a photodetector plate 1122. The photodetector plate 1122 can have a size similar to that shown in FIG. 5. Alternatively, a waveguide plate with attached photodiode(s) similar to that shown in FIG. 6 or 10 may be used. When a waveguide plate is used, the photodetector(s) can be arranged either on the waveguide plate similar to that shown in FIG. 6 or on the display substrate similar to that shown in FIG. 10.

Table 4 includes exemplary data from scanning the display pixels with constant current at 100 microamps (pixel size of 350 microns×480 microns). The data below may be stored in memory.

TABLE 4

| Pixel location | X = 1 | X = 2 | X = 3 | X = 4 | X = 5 | X = 6 | X = 7 | X = 8 | X = 9 | X = 10 |
|---|---|---|---|---|---|---|---|---|---|---|
| Y = 1 | 430 nA | 460 nA | 482 nA | 482 nA | 498 nA | 530 nA | 555 nA | 539 nA | 525 nA | 549 nA |
| Y = 2 | 560 nA | 562 nA | 530 nA | 530 nA | 540 nA | 572 nA | 570 nA | 565 nA | 520 nA | 520 nA |
| Y = 3 | 580 nA | 570 nA | 563 nA | 563 nA | 557 nA | 555 nA | 580 nA | 555 nA | 560 nA | 576 nA |
| Y = 4 | 550 nA | 538 nA | 527 nA | 520 nA | 510 nA | 538 nA | 510 nA | 539 nA | 536 nA | 539 nA |
| Y = 5 | 523 nA | 514 nA | 483 nA | 493 nA | 518 nA | 487 nA | 519 nA | 530 nA | 530 nA | 499 nA |
| Y = 6 | 515 nA | 499 nA | 469 nA | 492 nA | 483 nA | 494 nA | 500 nA | 493 nA | 490 nA | 488 nA |
| Y = 7 | 534 nA | 520 nA | 518 nA | 510 nA | 517 nA | 520 nA | 554 nA | 487 nA | 517 nA | 478 nA |
| Y = 8 | 523 nA | 543 nA | 530 nA | 520 nA | 528 nA | 529 nA | 554 nA | 543 nA | 534 nA | 530 nA |
| Y = 9 | 512 nA | 520 nA | 520 nA | 520 nA | 530 nA | 544 nA | 550 nA | 531 nA | 526 nA | 513 nA |
| Y = 10 | 434 nA | 441 nA | 463 nA | 486 nA | 495 nA | 495 nA | 520 nA | 504 nA | 478 nA | 480 nA |

Example 6

Example 6 shows that the data collected in any of the configurations described in Examples 1-5 can be used to adjust pixels 504 of the electronic device during regular (non-calibrating) display operation. A video signal may be sent to a display controller. The display controller may provide controller signals to a divider. The controller signals correspond to signals for the various pixels in the array. The data collected during calibration may be read from memory (see Table 4 for exemplary data) and sent to the divider. The divider can divide the controller signal for a specific pixel by the calibration signal for the same pixel. The quotient can be sent to a data driver to provide the proper data signal to the data line for the specific pixel. In one embodiment, signals for a row of pixels may be processed in a batch fashion so a common select line for the row may activate the pixels 504 for that row. The process continues for the other rows of pixels 504 in the array.

Example 7

Example 7 demonstrates another compensation route (mathematical function) in addition to that described in Example 6. Also, Example 7 shows that a correction scheme can be used to reduce the effects of stress damage in the display.

Figure 12:
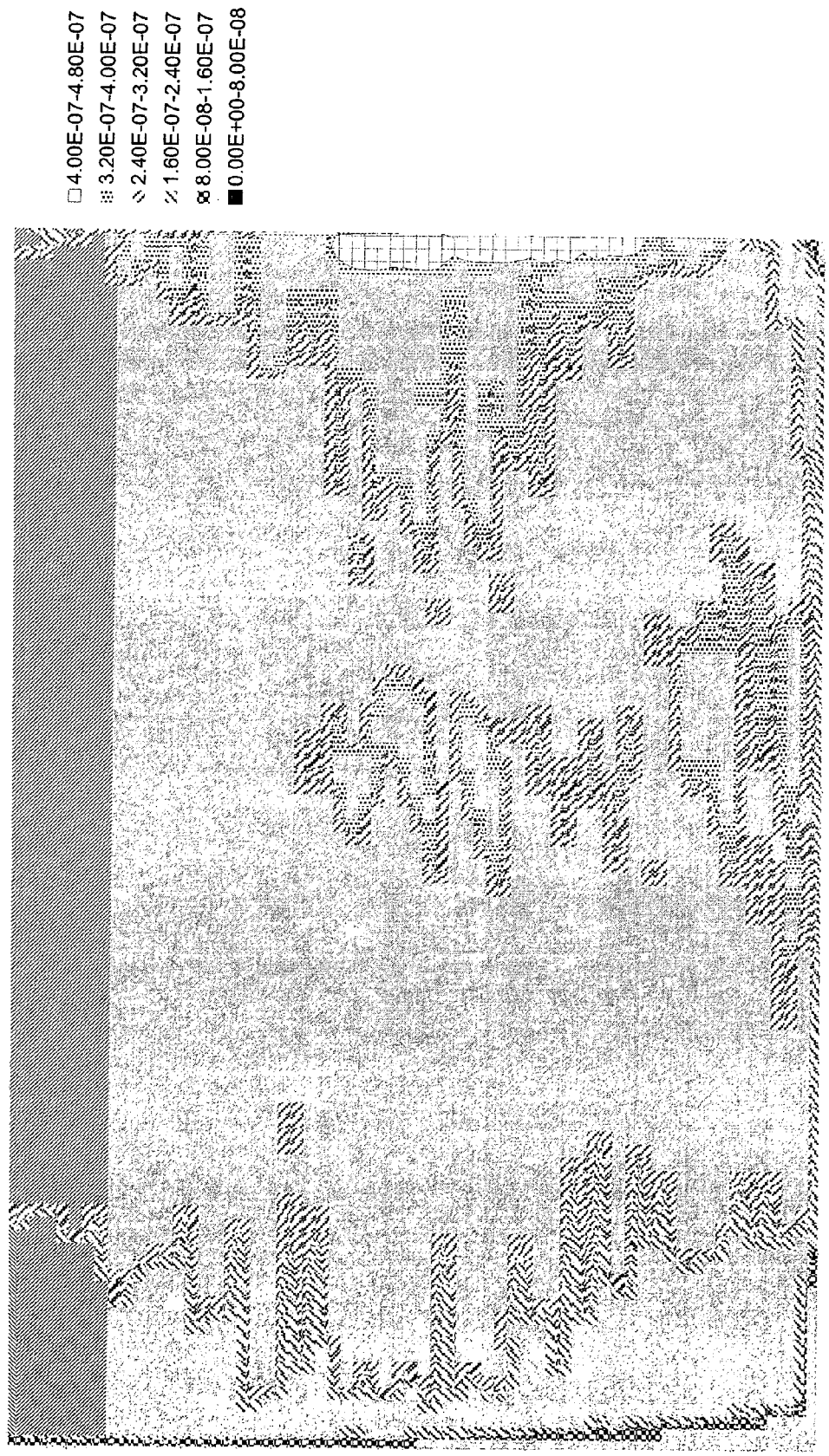
FIG. 12 includes an illustration of a display after an initial-state calibration.

Using computer-controlled equipment, an alternative correction scheme can be implemented for a 96×64 passive-matrix OLED display. A waveguide plate may be mounted on the display surface with several photodiodes attached to the edges of the waveguide plate (similar to FIGS. 8 and 9). The apparatus including the waveguide and photodiodes can be used to measure the emission from the display. Each pixel of the device can be driven sequentially at a given current ($I_{x,y}$) that may be a constant value of 40 μA, and the emission from that point can be measured (denoted as $L_{x,y}$). A map 1200 of the light emission from the initial (homogeneous) state of the display is illustrated in FIG. 12.

This display can be driven with a fixed image pattern over a substantial period of time at a high brightness (to accelerate the stress process). This can result in the retention of this image (inhomogeneous stress) during subsequent operation. After stressing the display, each pixel sequentially may be driven at a constant current (40 μA). A map 1300 can made of the light output of the display in the stressed state ($L'_{x,y}$), which appears as FIG. 13. The map 1300 includes burned-in blocks 1320.

A correction scheme can then be applied to the driving current, to reduce the effects of image retention (e.g., burned-in blocks 1320). A correction matrix ($C_{x,y}$) can be generated using the following formula:

$$C_{x,y} = \frac{\Delta L_{x,y}}{\Delta L_{x,y\max}} \times K(L_{x,y\max} - L'_{x,y\min}),$$

wherein:

$C_{x,y}$ is the correction factor for a specific radiation-emitting element;

$\Delta L_{x,y}$ is the change in intensity between a prior state and the most recent state of the specific radiation-emitting element;

$\Delta L_{x,y\ max}$ is the maximum change in intensity between a prior state and the most recent state of any radiation-emitting element in the array;

K is a proportionality constant relating current to intensity for the radiation-emitting elements;

$L_{x,y\ max}$ is the maximum intensity of any radiation-emitting element in the array during the initial state; and $L'_{x,y\ min}$ is the minimum intensity of any radiation-emitting element in the array during the most recent state.

The correction matrix may be stored in memory. The correction matrix has correction factors of the pixels for the most recent state of the display. The correction matrix can be used to correct the drive current provided to each pixel. An adder can add a prior drive current for a specific pixel and the correction factor for that pixel and send the sum to a data driver for the pixel. In mathematical terms:

$I'_{x,y} = I_{x,y} + C_{x,y}$, wherein:

$I_{x,y}$=initial drive current (array, constant for all x,y in this example)

$I'_{x,y}$=corrected drive current (array)

$C_{x,y}$=correction matrix (array)

Figure 14:
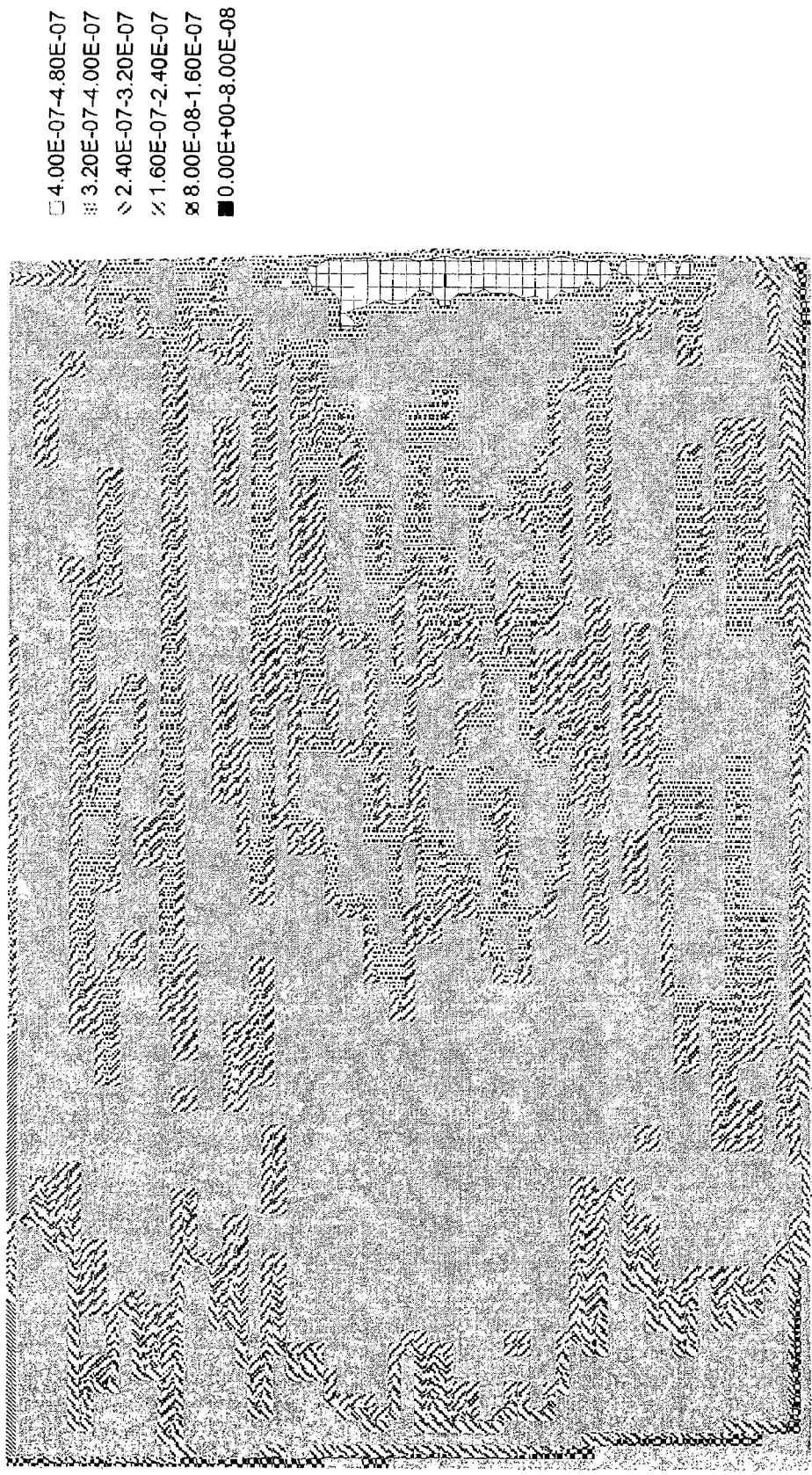
FIG. 14 includes an illustration of the display of FIG. 12 after a most recent calibration performed to correct for the burned-in image seen in FIG. 13.

FIG. 14 includes an image 1400 that can be produced using the correction factors from the correction matrix to adjust for burned-in text, blocks, or other artifacts.

Example 8

Example 8 demonstrates yet another compensation route (mathematical function) in addition to that described in Examples 6 and 7. Similar to Example 7, Example 8 can be used to reduce the effects of stress damage in the display.

Figure 15:
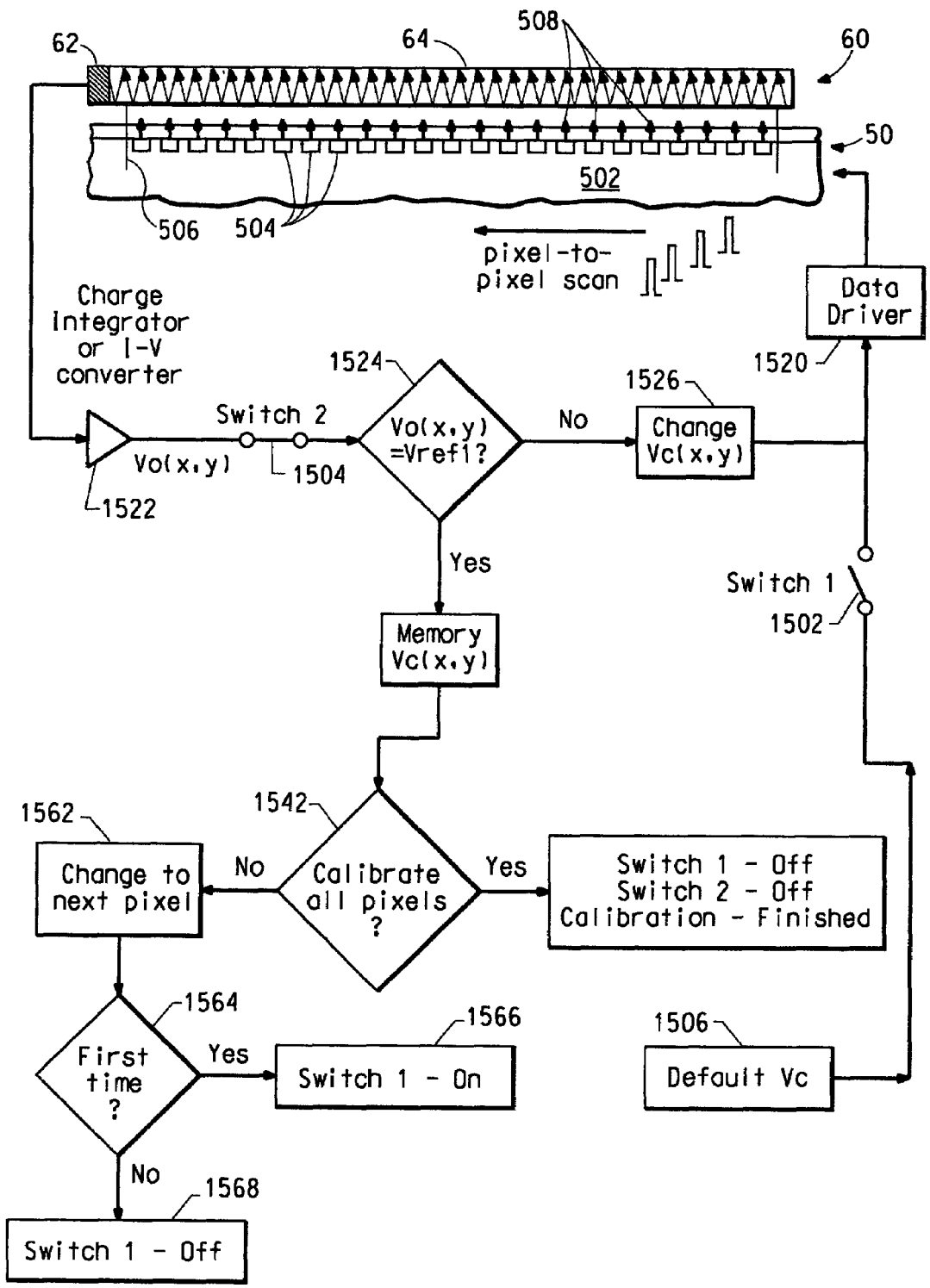
FIG. 15 includes an illustration of a hybrid cross-sectional view of a radiation-sensing apparatus, an electronic device being calibrated, and a process flow chart during a calibration operation.

FIG. 15 includes an illustration of the calibrating system illustrated in FIG. 6 in combination with a partial flow diagram during a calibrating operation of the electronic device 50. Initially, switches 1502 and 1504 are closed. Switch 1504 will remain closed during the calibration operation. A default calibrating voltage ($V_c$) 1506 can be supplied through switch 1502 to the data driver 1520. The data driver 1520 can send a signal to a specific pixel 504 within array.

As that pixel 504 is activated, light 508 emitted from that pixel 504 may be sent along waveguide 64 to a photosensor 62. The signal from the photosensor 62 can then be sent to a charge integrator or a current-voltage (I-V) converter 1522. If the signal from the photosensor is a potential, the integrator or converter may not be needed. The voltage for a specific pixel can be denoted as $V_0(x, y)$. The signal passes through switch 1504 and a decision is made whether $V_0(x, y)$ is within tolerance. In one embodiment, $V_0(x, y)$ may need to be a reference voltage, $V_{ref1}$, plus or minus a predetermined value (e.g., $V_{ref1}$ +/-4%). If not, the output signal for that pixel is not within the range ("no" branch of diamond 1524). Switch 1502 may then be opened and a changed calibration voltage ($V_c(x, y)$) is sent to the data driver 1520. This iterative loop can continue until $V_0(x, y)$ is within the specified range.

After the $V_0(x, y)$ is within tolerance, the corresponding calibrating voltage for the specific pixel 504, $V_c(x, y)$, can be stored in memory as illustrated in block 1528. The process continues with a determination whether all pixels 504 have been calibrated (diamond 1542). If not, the process continues by changing to the next pixel 504 as illustrated in block 1562. If this is the first time that the next pixel is measured during the current calibration sequence, then switch 1502 may be closed as shown by block 1566. If any reading has been made for the next pixel 504 during this specific calibration operation, then switch 1502 will be opened as illustrated by block 1568. Similar to the first pixel 504, an iterative loop may be performed until the output voltage is within the proper tolerance. When all pixels have been calibrated ("yes" branch of diamond 1542), the calibration is finished and switches 1504 and 1502 will be opened.

The logic and other operations described with respect to FIG. 15 may be performed by circuitry within the electronic device 50, within a separate apparatus used for the calibration system, a remote computer (not shown), or a combination thereof. After reading this specification, skilled artisans appreciate that this is just one of several potential calibrating operations that can be used with the electronic devices as described. Clearly, other calibrating operations are contemplated and may be used. One of ordinary skill in the art will appreciate that the level of homogeneity in the display can be made higher or lower simply by modifying the tolerance on the reference voltage.

Figure 16:
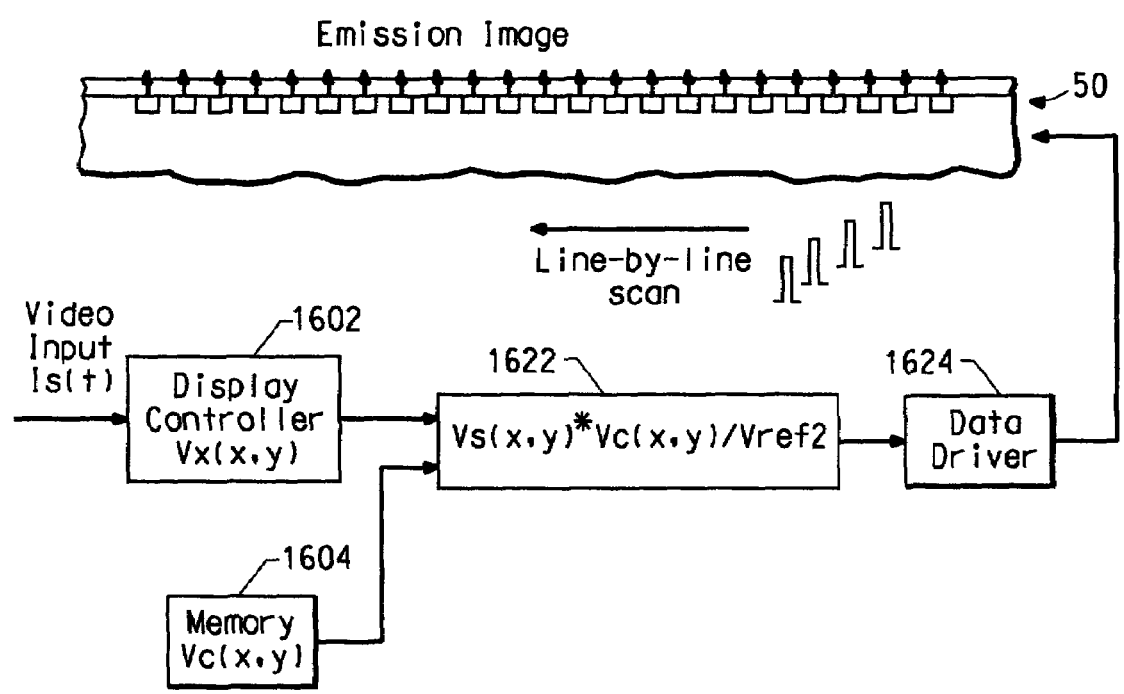
FIG. 16 includes an illustration of a hybrid cross-sectional view of an electronic device after calibrating and a process flow chart during a regular operation of the electronic device.

FIG. 16 includes an illustration of the electronic device 50 and the logic used during the regular (non-calibrating) operation of the electronic device 50. A video input signal, $I_s(t)$, or other information in the form of signals may be sent to a display controller 1602. The display controller can generate a signal, such as $V_s(x,y)$, that can be sent to an intensity adjusting logic unit 1622. The calibrating voltage for the specific pixel, $V_c(x,y)$ can be read from memory also input into the logic unit 1622. The logic unit 1622 can process the information to create a signal that is fed to the data driver 1624. The signal can be within a range of approximately ten percent of a value calculated by taking the product of $V_s(x,y)$ and $V_c(x,y)$ and dividing the product by $V_{ref2}$, which is a reference voltage for the array. The data driver 1624 can apply the appropriate signals to the specific pixel at location x,y within the matrix. In one embodiment, information for a row of pixels 504 may be processed to provide signals to data lines for the row of pixels 504. A row array strobe can be used to activate a common select line for the row of pixels. This operation can be repeated for other rows within the array.

Example 9

Example 9 demonstrates still another methodology to reduce the effects of stress damage in the display.

Figure 13:
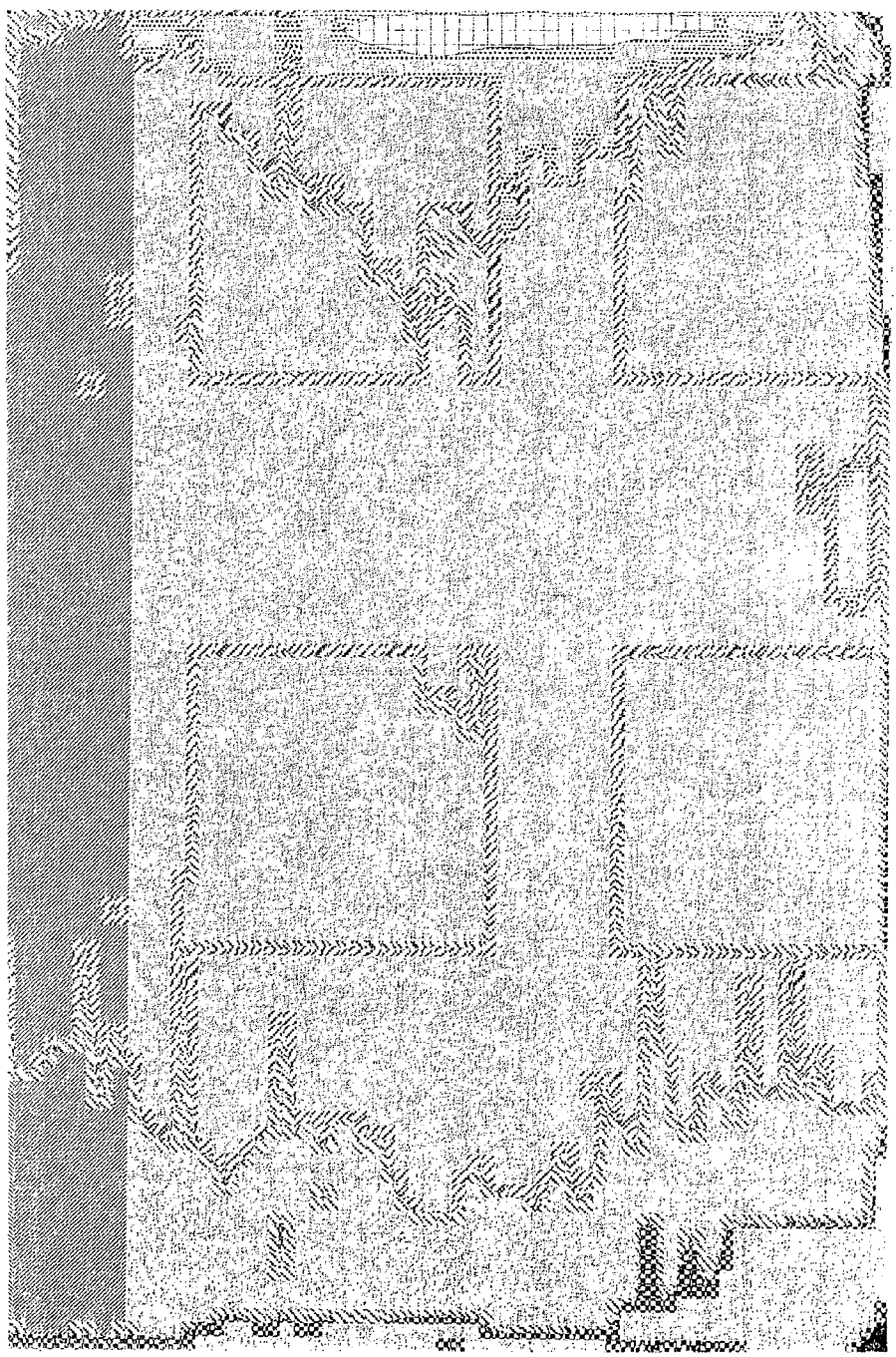
FIG. 13 includes an illustration of the display of FIG. 12 after images have been burned into the display.

An electronic device similar to the one illustrated in FIG. 6 may be used. Its initial and stressed displays may generate maps as illustrated in FIGS. 12 and 13. In this embodiment, output signals from the photosensor 62 may be used. For a specific pixel, its initial state reading from FIG. 12, and its stressed reading from FIG. 13 may be used to generate a correction factor according to the following formula:

$C_{x,y} = L_{x,y}$', wherein:

$C_{x,y}$ is the correction factor for $pixel_{x,y}$;

$L_{x,y}$ is the measured output for $pixel_{x,y}$ during the initial state; and $L_{x,y}$' is the measured output for $pixel_{x,y}$ during after the stressed state.

A video signal may be sent to a display controller. The display controller may provide controller signals to a divider. The controller signals correspond to signals for the various pixels in the array. The correction factors can be sent to the divider. The divider can divide the controller signal for a specific pixel by the correction factor for the same pixel. The quotient can be sent to a data driver to provide the proper data signal to the data line for the specific pixel. FIG. 14 may represent a map of a corrected display. Alternatively, potentials may be used instead of current.

In general, the input signals may be added to, multiplied by or divided by the correction factors. The drive current used for a pixel is generally going to be proportional to the drive signal used during calibration, inversely proportional to the output signal during calibration, or both. The signals may be measured as a current or a voltage. If the drive signal during calibration for a specific pixel gets too high (i.e., above a specified limit, such as ten times higher than the average of other pixels in the array), that pixel may be considered "dead" and no longer used. Its statistics may not be used in determining overall or average values for the array.

Many other embodiments are possible beyond those previously described. Theoretically, the radiation-sensing elements or optical couplers may lie at many different locations within an electronic device. For example, the photosensor(s) or waveguide may lie within an intervening electrical insulating layer between pixels 504 and a shield or passivating layer.

Prior embodiments have illustrated photosensors, waveguides, and reflectors lying outside the pixels, themselves. In an embodiment not shown, photosensor(s) or waveguide(s) may lie between the driver circuits for the pixels or subpixels and their corresponding radiation-emitting elements. Each pixel could have a radiation-emitting element and a radiation-sensing element. The electrode for the radiation-sensing element closer to the radiation-emitting element may be sufficiently transparent to the radiation from the radiation-emitting element to allow radiation to be detected and measured by the radiation-sensing element.

If each pixel 504 includes a corresponding radiation-sensing element, the calibration can be performed with as little as one iteration for measuring all pixels 504 within the array. Alternatively, the array can be broken up into a complementary checkerboard pattern during calibration. The pattern would be similar to the red-black pattern of a checkerboard. During a first set of measurements, the pixels 504 corresponding to the "red" squares would be measured. During a second set of measurements, the pixels corresponding to the "black" squares would be measured. In this manner, cross talk between immediately adjacent pixels 504 is substantially eliminated. Either of these methods can significantly reduce time needed for calibration.

Alternatively, a series of photosensors or waveguides in shapes corresponding to rows or columns may be used. In one specific example, a plurality of waveguides and sensors can be used. The waveguides may have shapes that generally correspond to the shapes of the rows within the array. One or two photosensors may lie at the ends of the waveguides at locations outside the array. During calibration, one pixel in every other row may be measured at the same time. In this manner, with a 10×10 pixel matrix for example, measuring time may be decreased by five times compared to the pixel-by-pixel measurement scheme.

Signals used for measuring or driving the pixels may be performed by using current, voltage, or a combination thereof (with the use of conventional I-V or V-I converters). Current dividers may be replaced by voltage dividers, and vice versa.

The concepts used in the embodiments are not limited to radiation within the visible light spectrum. Other radiation, such as ultraviolet, infrared, and the like, may be used with the emitting and calibrations methods herein.

For a full-color display, the calibration procedure may be repeated for each subpixel, and potentially for combination (s) of subpixels. For example, the calibration may be performed for each of the colors of the subpixels (i.e., red, green, and blue). Another measurement may be taken to ensure proper color balance between the subpixels to achieve white light (not too strong in red, green, or blue). Additional measurements may be taken for binary combinations (red and green (no blue), red and blue (no green), green and blue (no red)).

In still another alternate embodiment, if a pixel requires too much potential or current to operate (above a specified limit), that pixel may be turned off to allow sufficient current or potential to reach each of the pixels. In this manner, substantially all pixels are still being adjusted although one pixel in the array may be off.

Benefits may accrue to users of the electronic devices and calibrating systems. The embodiments and methods described herein can be implemented without changing the pixel circuit. This simplifies integration and does not complicate design simulations when different materials or geometries are used for the circuit elements within the pixel circuit.

The methods are highly flexible. Many different compensating schemes can be used. The ones described herein are merely exemplary of the nearly infinite number of different methodologies and equations that can be used. In general, measurements from the pixels are taken, and based on those measurements, the drive signals are adjusted to allow homogeneity of intensity among the pixels in the array. The display looks more uniform and appealing to a user.

The calibrating operation may be performed at nearly anytime desired by a user of the electronic device 50. In some instances, if all electronic circuitry is contained within an electronic device, the calibrating operation may be performed by selecting a calibration mode on the electronic device. Otherwise, the calibrating may be performed with an external apparatus while coupled or connected to the electronic device.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. An electronic device comprises:
a first radiation-emitting element lying within a pixel; and
a first radiation-sensing element for sensing radiation emitted from the first radiation-emitting element wherein:
the first radiation-sensing element lies outside the pixel;
the radiation-sensing element is part of a calibrating system; and
the radiation-sensing element is not part of a radiation-emitting circuit; and the radiation-sensing element is located outside the projected area containing the radiation-emitting element.

2. The electronic device of claim 1, wherein the first radiation-sensing element lies at a location selected from:
between the first radiation-emitting element and the user side of the electronic device; and
farther from the user side of the electronic device compared to the first radiation-emitting element.

3. The electronic device of claim 1, further comprising a waveguide, wherein the waveguide optically couples the first radiation-emitting element to the first radiation-sensing element.

4. The electronic device of claim 3, wherein the waveguide lies at a location selected from:
between the first radiation-emitting element and the user side of the electronic device; and
farther from the user side of the electronic device compared to the first radiation-emitting element.

5. The electronic device of claim 3, wherein:
the electronic device includes a plurality of radiation-emitting elements, including the first radiation-emitting element, within an array;
the array has an array edge;
the waveguide has a waveguide edge adjacent to the array edge; and
the first radiation-sensing element is connected to the waveguide edge.

6. The electronic device of claim 3, wherein:
the electronic device includes a plurality of radiation-emitting elements, including the first radiation-emitting element, within an array;
the array has array edges;
the waveguide has waveguide edges adjacent to the array edges; and
a plurality of radiation-sensing elements, including the first radiation-sensing element, is connected to the waveguide edges.

7. The electronic device of claim 1, wherein the first radiation-emitting element is not electrically connected to the first radiation-sensing element.

8. The electronic device of claim 1, wherein the first radiation-emitting element is not electrically coupled to the first radiation-sensing element.

9. An electronic device comprises:
a first radiation-emitting element;

a waveguide; and a first radiation-sensing element, wherein:

the waveguide optically couples the first radiation-emitting element to the first radiation-sensing element;

the radiation-sensing element is not part of a radiation-emitting circuit; and the radiation-sensing element is part of a calibrating system; and the radiation-sensing element is located outside the projected area containing the radiation-emitting element.

10. The electronic device of claim 9, wherein the waveguide lies at a location selected from:

between the first radiation-sensing element and the user side of the electronic device; and farther from the user side of the electronic device compared to the first radiation-sensing element.

11. The electronic device of claim 9, wherein:

the electronic device includes a plurality of radiation-emitting elements, including the first radiation-emitting element within an array;

the array has an array edge;

the waveguide has a waveguide edge adjacent to the array edge; and the first radiation-sensing element is connected to the waveguide edge.

12. The electronic device of claim 9, wherein:

the electronic device includes a plurality of radiation-emitting elements, including the first radiation-emitting element, within an array;

the array has array edges;

the waveguide has waveguide edges adjacent to the array edges; and a plurality of radiation-sensing elements, including the first radiation-sensing element, is connected to the waveguide edges.

13. The electronic device of claim 9, wherein the first radiation-emitting element comprises a transparent anode and a transparent cathode.

* * * * *